US011832500B2

(12) United States Patent
Becker et al.

(10) Patent No.: US 11,832,500 B2
(45) Date of Patent: Nov. 28, 2023

(54) MULTI-FUNCTIONAL PIXELS DESIGNED FOR TRANSMISSION MATCHING IN TRANSPARENT DISPLAYS HAVING TRANSPARENT REGIONS BETWEEN THE PIXELS

(71) Applicant: L3Harris Technologies, Inc., Melbourne, FL (US)

(72) Inventors: Jacob J. Becker, Gilbert, AZ (US); Jon D. Burnsed, Tempe, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 132 days.

(21) Appl. No.: 17/501,271

(22) Filed: Oct. 14, 2021

(65) Prior Publication Data

US 2023/0120113 A1     Apr. 20, 2023

(51) Int. Cl.
*H10K 59/131* (2023.01)
*G02B 23/12* (2006.01)
(Continued)

(52) U.S. Cl.
CPC .............. *H10K 59/65* (2023.02); *H10K 71/00* (2023.02); *H10K 77/10* (2023.02);
(Continued)

(58) Field of Classification Search
CPC ........ H10K 59/65; H10K 71/00; H10K 77/10; H10K 59/1201; H10K 59/131; H10K 59/351; G02B 23/12
(Continued)

(56) References Cited

U.S. PATENT DOCUMENTS 8,830,204 B2     9/2014  Sultenfuss et al.
2008/0266431 A1*  10/2008  Ohyama .............. H04N 25/134
                                                          382/106
(Continued)

FOREIGN PATENT DOCUMENTS

WO     2007049213        5/2007
WO     2020/220533 A1   11/2020
(Continued)

OTHER PUBLICATIONS

U.S. Appl. No. 16/868,306, filed May 6, 2020.
(Continued)

*Primary Examiner* — Que Tan Le
*Assistant Examiner* — Mai Thi Ngoc Tran
(74) *Attorney, Agent, or Firm* — Workman Nydegger

(57) ABSTRACT

One embodiment illustrated herein includes an optical device. The optical device includes a stacked device, formed in a single semiconductor chip, configured to be coupled in an overlapping fashion to an underlying device. The stacked device includes a plurality of optical output pixels. Each of the output pixels includes a plurality of subpixels. Each subpixel is configured to output a color of light. Each pixel is configured to output a plurality of colors of light. The optical device further includes one or more detectors, configured to detect light, interleaved with the subpixels of the pixels. The stacked device comprises a plurality of transparent regions formed in the stacked device between the pixels. The plurality of transparent regions are transparent, according to a first transmission efficiency, to light in a first spectrum. The underlying device emits light in the first spectrum.

20 Claims, 6 Drawing Sheets

(51) Int. Cl.
  *H10K 59/65* (2023.01)
  *H10K 77/10* (2023.01)
  *H10K 71/00* (2023.01)
  *H10K 59/12* (2023.01)
  *H10K 59/35* (2023.01)

(52) U.S. Cl.
  CPC ....... *H10K 59/1201* (2023.02); *H10K 59/131* (2023.02); *H10K 59/351* (2023.02)

(58) Field of Classification Search
  USPC ...................................................... 250/208.1
  See application file for complete search history.

(56) References Cited

U.S. PATENT DOCUMENTS

| | | |
|---|---|---|
| 2015/0331508 A1 | 11/2015 | Nho et al. |
| 2016/0181330 A1 | 6/2016 | Liu |
| 2019/0340409 A1 | 11/2019 | Zhu et al. |
| 2020/0083304 A1 | 3/2020 | Ye |
| 2020/0400944 A1 | 12/2020 | Burnsed et al. |
| 2021/0224503 A1 | 7/2021 | Cheng |

FOREIGN PATENT DOCUMENTS

| | | |
|---|---|---|
| WO | 2021/031117 A1 | 2/2021 |
| WO | 2021/063053 A1 | 4/2021 |

OTHER PUBLICATIONS

Anonymous: "Subpixel rendering—Wikipedia", Retrieved from https://web.archive.org/web/20210702133933/https://en.wikipedia.org/wiki/Subpixel_rendering , Retrieved on Feb. 14, 2023, pp. 13.

European Search Report received for EP Patent Application No. 22201299.9, dated Mar. 2, 2023, 14 pages.

* cited by examiner

MULTI-FUNCTIONAL PIXELS DESIGNED FOR TRANSMISSION MATCHING IN TRANSPARENT DISPLAYS HAVING TRANSPARENT REGIONS BETWEEN THE PIXELS

BACKGROUND

Background and Relevant Art

Night vision systems allow a user to see in low-light environments without external human visible illumination. This allows for covert vision in a low-light environment to prevent flooding the environment with human visible light and/or protects the user from being detected due to causing human visible light or light that is otherwise detectable to other night vision systems to be emitted.

Some night vision systems function by receiving low levels of light reflected off of, or emitted from objects and providing that light to an image intensifier (sometimes referred to as $I^2$). The image intensifier has a photocathode. When photons strike the photocathode, electrons are emitted through a vacuum tube, and directed towards a microchannel plate to amplify the electrons. The amplified electrons strike a phosphor screen. The phosphor screen is typically chosen such that it emits human visible light when the amplified electrons strike the phosphor screen. The phosphor screen light emission is coupled, typically through an inverting fiber-optic, to an eyepiece where the user can view the illuminated phosphor screen, thus allowing the user to see the objects.

Recent advances in night vison technology have allowed for simultaneous display of digital information overlaid on intensifier tube images. In particular, transparent and/or semi-transparent digital display chips can be placed at the output of the intensifier tubes such that light from the intensifier tubes passes through the digital display chips, while the digital display chips simultaneously display digital information to a user. These digital chips may further include detector circuits to detect light from the intensifier tube, or other sources.

Transparent display and detector chips, when used in conjunction with an image intensifier tube, rely on transmission of the underlying screen image through the chip to allow for simultaneous overlay of digital information and/or light detections and viewing of the night vision scene. This results in a trade-off between tube performance and display and/or detector performance with different applications necessitating different configurations. Embodiments implementing detectors and display elements can be particularly challenging as the addition of detector elements creates more space on the chip where light cannot pass through the chip due to those areas having opaque display and detector elements (e.g., LEDs and photodiodes). Thus, for example, to have a photodetector with the same resolution as a display, two pixels are needed for each pixel of display resolution, one pixel for the display and a second pixel for the detector. This can reduce light transmission through the display and detector chips in at least half (or even more due to the control circuits that need to be implemented for each element).

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes an optical device. The optical device includes a stacked device, formed in a single semiconductor chip, configured to be coupled in an overlapping fashion to an underlying device. The stacked device includes a plurality of optical output pixels. Each of the output pixels includes a plurality of subpixels. Each subpixel is configured to output a color of light. Each pixel is configured to output a plurality of colors of light. The optical device further includes one or more detectors, configured to detect light, interleaved with the subpixels of the pixels. The stacked device comprises a plurality of transparent regions formed in the stacked device between the pixels. The plurality of transparent regions are transparent, according to a first transmission efficiency, to light in a first spectrum. The underlying device emits light in the first spectrum.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein are able to minimize the space that display and detector elements occupy on a transparent chip, and thereby maximize light transmission though the chip, by interdigitating the detector functionality as a subpixel of a display pixel. This results in pixel architectures which allow for increased display/detector capabilities (when averaged over the whole active area) while maintaining a higher transmission within the individual pixels, than in previous systems.

For example, a device may include a plurality of optical output pixels. Each of the output pixels includes a plurality of subpixels. Each subpixel is configured to output a color of light. Thus, each pixel is configured to output a plurality of colors of light. The device further includes one or more detectors configured to detect light. These detectors are interleaved with the subpixels. Thus, a given pixel may include display elements and one or more detector elements. That is, in some embodiments, detector elements are implemented in a subpixel form factor.

The device includes transparent regions formed in the device between the pixels. The transparent regions are at least partially transparent, according to a particular transmission efficiency, to light in a particular spectrum. The device will typically be used with an underlying device that is sensitive to, or emits light in the first spectrum.

Figure 1:
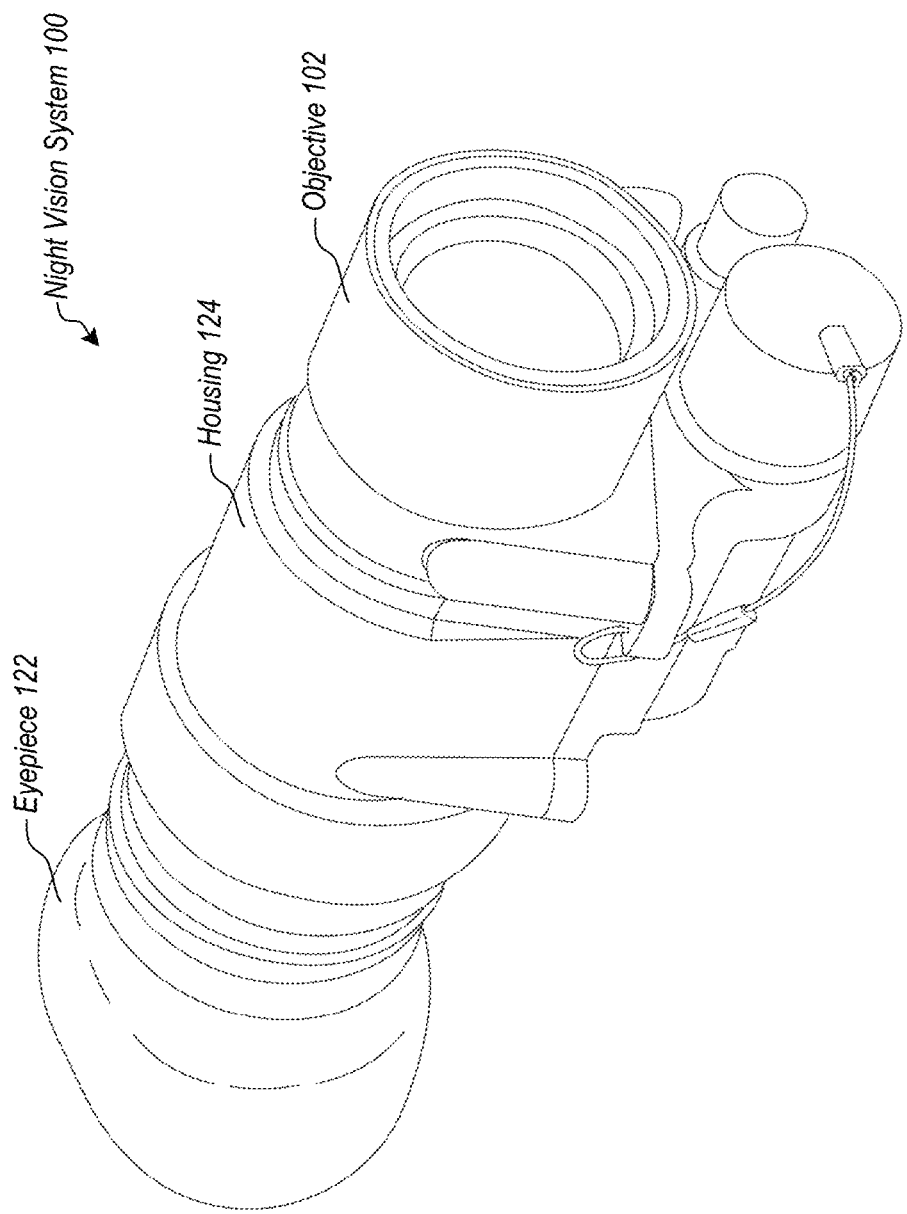
FIG. 1 illustrates a nightvision system.

Additional details are illustrated. Attention is now directed to FIG. 1, where a specific example of a nightvision system is illustrated. In particular, FIG. 1 illustrates the PVS—14 nightvision system 100. In the example illustrated, the nightvision system 100 includes a housing 124. As will be illustrated in more detail below in other figures, the housing 124 houses an image intensifier, a transparent display, and various other components. The nightvision system 100 further includes an objective 102 which receives weak light reflected and/or generated in an environment. The objective 102 includes optics such as lenses, waveguides, and/or other optical components for receiving and transmitting light to an image intensifier, discussed in more detail below. The nightvision system 100 further includes an eyepiece 122. The eyepiece 122 includes optics for focusing images created by the nightvision system 100, including images created by an image intensifier and images created by a transparent display, into the eye of the user.

Figure 2:
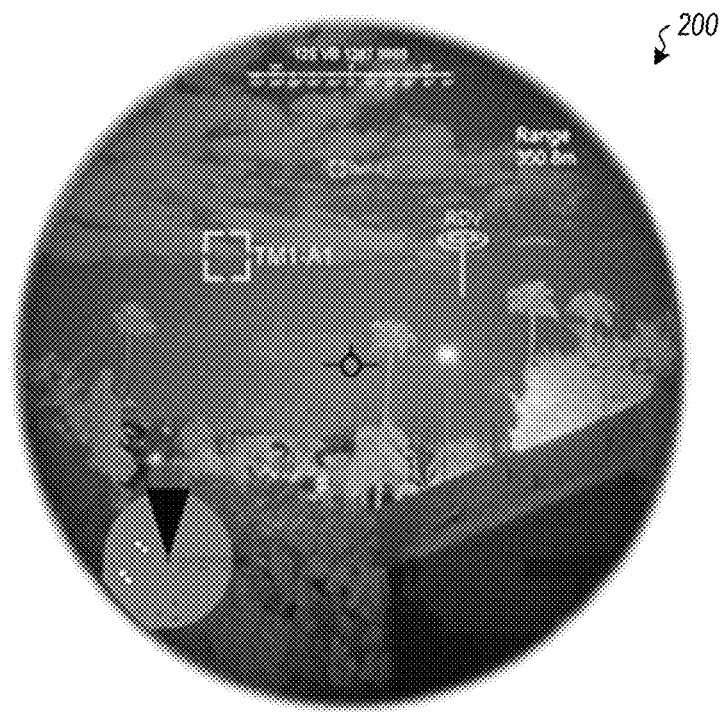
FIG. 2 illustrates a nightvision scene image with heads-up display functionality.

As discussed above, and with reference to FIG. 2, modern ancillary functionality can be added to existing nightvision systems. FIG. 2 illustrates an image 200 including a heads-up display displayed on a nightvision image output from an intensifier tube. Some embodiments described herein are directed to implementing a heads-up display implemented by adding image overlay capabilities with a nightvision system, where the image overlay capabilities are added by using a transparent display.

The heads-up display may display to the user, in or around the field-of-view of an environment, various pieces of information to create an augmented reality (AR) environment. Such information may include, for example, a navigational heading, the speed at which the user is moving, coordinates, communication messages (such as email, SMS, etc.), time of day or other timing information, vital signs for the user such as heart rate or respiration rate, indicators indicating whether an object being viewed by the nightvision system is friendly or adversarial, battery charge level for the nightvision system or other devices, weather conditions, contact information, audio information (such as volume, playlist information, artist, etc.), etc. In some embodiments, the heads-up display can superimpose thermal image data over intensified light images. In particular, a nightvision system 100 may include (or at least have access to data from) thermal cameras for detecting thermal characteristics in an environment. Data from thermal cameras can be used to control the transparent display 318 to display thermal imaging data, correlated with artifacts in intensified light images, to the user. For example, various colors can be used to represent various temperatures where the colors are output by the transparent display 318 to the user. The colors are overlaid on intensified light image artifacts to indicate temperature of objects in an environment. Note that the transparent display 318 (or other elements) may include photodetectors for detecting intensified light to determine the locations of various objects in the field of view. This information can be used for correlating thermal colors, target indicators, or other images output by the transparent display 318. Note also that due to psychovisual perception in humans, there is no need to fully colorize an intensified light image. Rather, some embodiments, can use color oversaturated grid lines, horizontal lines, diagonal lines, dots, or event text to create a perception of colorization for monochrome image intensifier images. An example of this technology is referred to as the color assimilation grid. In some embodiments, by using colored text, additional textual information can be provided when the user focuses their attention on the text, but when the user focuses on the image as a whole, the colored text will serve to simply colorize the image due to the psychovisual perception phenomenon discussed above.

Figure 3:
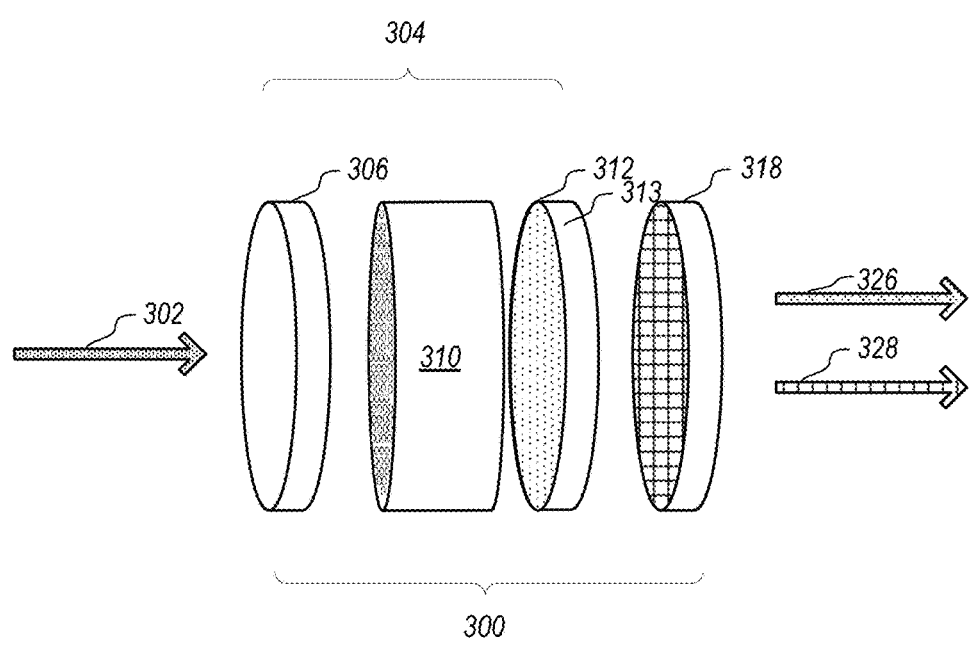
FIG. 3 illustrates a block diagram of components of a nightvision system.

Attention is now directed to FIG. 3. FIG. 3 illustrates a block diagram version of a nightvision system 300. While not shown in FIG. 3, a nightvision system typically includes an objective (such as that shown in FIG. 1 at 102) to focus input light 302 into an underlying device 304. Such input light may be, for example, from ambient sources, such as light from heavenly bodies such as stars, the moon, or even faint light from the setting sun. Additionally, or alternatively, ambient sources could include light from buildings, automobiles, or other faint sources of light that cause reflection of light from an object being viewed in a nightvision environment into the objective. A second source of light may be light being emitted from an external source towards an object, reflected off the object, and into the objective. For example, the source may be an infrared source that is not detectable in the visual spectrum for human observers. A third source of light may be light emitted by an object itself. For example, this may be related to infrared heat energy emitted by the object and directed into the objective. Nonetheless, the nightvision system is able to convert the light emitted from the source into a viewable image for the user.

The objective directs any input light 302 into the underlying device 304. Note that the underlying device 304 may include functionality for amplifying light received from the objective to create a sufficiently strong image that can be viewed by the user. This may be accomplished using various technologies such as a photocathode 306, a microchannel plate 310, and a phosphor screen 312. The photocathode 306 may be configured to generate photo electrons in response to incoming photons. Electrons from the photocathode 306 are emitted into the microchannel plate 310. Electrons are multiplied in the microchannel plate 310.

Electrons are emitted from the microchannel plate 310 to a phosphor screen 312 which glows as a result of electrons striking the phosphor screen 312. This creates a monochrome image from the input light 302.

A fiber-optic 313 carries this image as intensified light to the eyepiece (such as eyepiece 122 illustrated in FIG. 1) of a nightvision system where it can be output to the user. This fiber-optic 313 can be twisted 180 degrees to undo the inversion caused by the system objective to allow for convenient direct viewing of the screen.

FIG. 3 further illustrates the transparent display 318. The transparent display 318 allows intensified light 328 to pass (at least partially) through the transparent display 318, but also generates its own light, from LEDs or other light emitters, to transmit to a user. Creating a transparent display may be accomplished, for example, using the teachings of U.S. patent application Ser. No. 16/868,306, filed on May 6, 2020, titled "Backside Etch Process For Transparent Silicon Oxide Technology", which is incorporated herein by reference, in its entirety.

The transparent display 318 is typically implemented behind the fiber-optic 313 (i.e., closer to the eyepiece than the fiber-optic), but in other embodiments may be implemented in front of the fiber-optic 313. The use of a fiber-optic within night vision systems inverts and translates the focal plane allowing the transparent display overlay to be presented on either side without impacting the ability for the eyepiece to focus on the image. However, certain manufacturing or mechanical constraints may incentivize placement of the transparent display behind the fiber-optic including the difficulty in inserting electronics within the vacuum package. Placing the transparent display external to the fiber-optic 313 can be done to allow the transparent display 318 to be applied after the image intensifier tube has been manufactured and sealed, lowering production difficulties.

As discussed above, the transparent display 318 may include functionality for displaying information to a user. Such information may include graphical content, including text, images, and the like. In some embodiments, the transparent display 318 may display in shaded monochrome. Alternatively, or additionally, the transparent display 318 may display in multiple colors. Alternatively, or additionally, the transparent display 318 may display in 1-bit monochrome.

In the example illustrated in FIG. 3, the transparent display 318 outputs display light 326 which can be sent to the eyepiece (such as the eyepiece 122 illustrated in FIG. 1). As noted previously, the intensified light 328 is also provided to the eyepiece. Thus, an image such as that illustrated in FIG. 2 is presented to the user in the nightvision system.

As noted previously, the transparent display 318 is composed of an active silicon area having active elements. The different active elements cause the active area to have certain optical performance capabilities. Such capabilities may be one or more of abilities to output color output, output monochrome output, detect light, have a certain pixel density, have a certain pitch, etc. In particular, the transparent display 318 is a digital display having a certain pixel density. Often, each pixel is implemented on a single active island, although in other embodiments, an island may have multiple pixels, or even only a single subpixel element. Each pixel has one or more transistors controlling one or more OLED emitters (or other light emitting devices). Some pixels include light detectors. This can be useful for detecting the intensified light from the phosphor screen 312. This detected light can be used to characterize an image intensifier image. For example, the detected light can be used for recording scene events. Alternatively, or additionally, the detected light can be used for improving placement of elements displayed on the heads-up display shown in FIG. 2. For example, edge detection techniques may be used using the detected light, and images generated and displayed by the display 318 can be keyed off of these detected edges.

Figure 5:
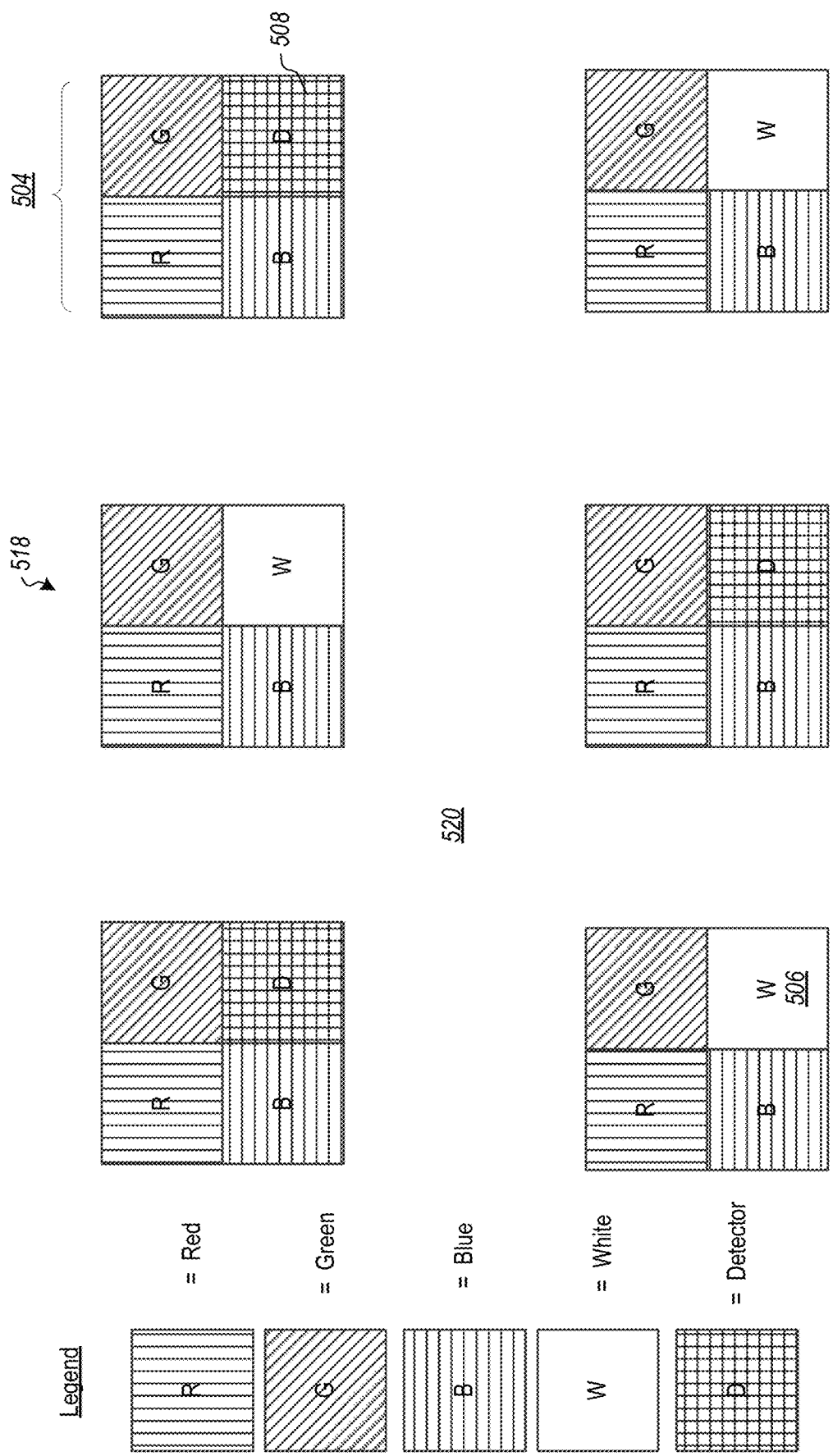
FIG. 5 illustrates a transparent display having display elements interdigitated among subpixel display elements.

Thus, embodiments implement a transparent display that further includes detector functionality. That is, both light emitters and light detectors are implemented in the active area of the transparent display 318 as illustrated in FIGS. 3 and 5. In any case, the transparent display 318 is representative of a stacked device formed in a single semiconductor chip that overlaps an underlying device 304, in this case, the underlying device 304 is an image intensifier. The stacked device is transparent to light in a first spectrum (according to some predefined transmission efficiency), which in this case is the visible spectrum of light output by the phosphor screen 312. That is, the transparent display 318 is not fully transparent due to the blocking of the active devices, but transparency referred to herein refers to at least partial transparency according to some transmission efficiency. Note that overlapping as used herein means that elements are in the same optical path. This can be accomplished by having elements be in coaxial alignment when the optical path is straight. Alternatively, this can be accomplished by using various waveguides or other elements to align optical paths thus not requiring physical coaxial alignment.

As noted previously, embodiments implement a photodetector. The photodetector absorbs a portion of the intensified light converting it to an electrical signal. For example, the photodetector can be a two-dimensional array of light detectors, such as photodiodes, that generates a charge current, or any other form of digital data level proportional to intensity of the intensified light as a function of position. Accordingly, the photodetector may generate a two-dimensional array of electrical charge that represents the intensified image. In some embodiments, this two-dimensional array of electrical charge can be periodically read from the photodetector (e.g., the detected signal can be read from the photodetector like in a charged coupled device (CCD) camera). In some embodiments, the two-dimensional array of electrical signals from the photodetector is processed and/or used locally, e.g., within the transparent display 318 device, at the readout or pixel levels, to modulate in real time the amplitude of the display light 326.

Figure 4:
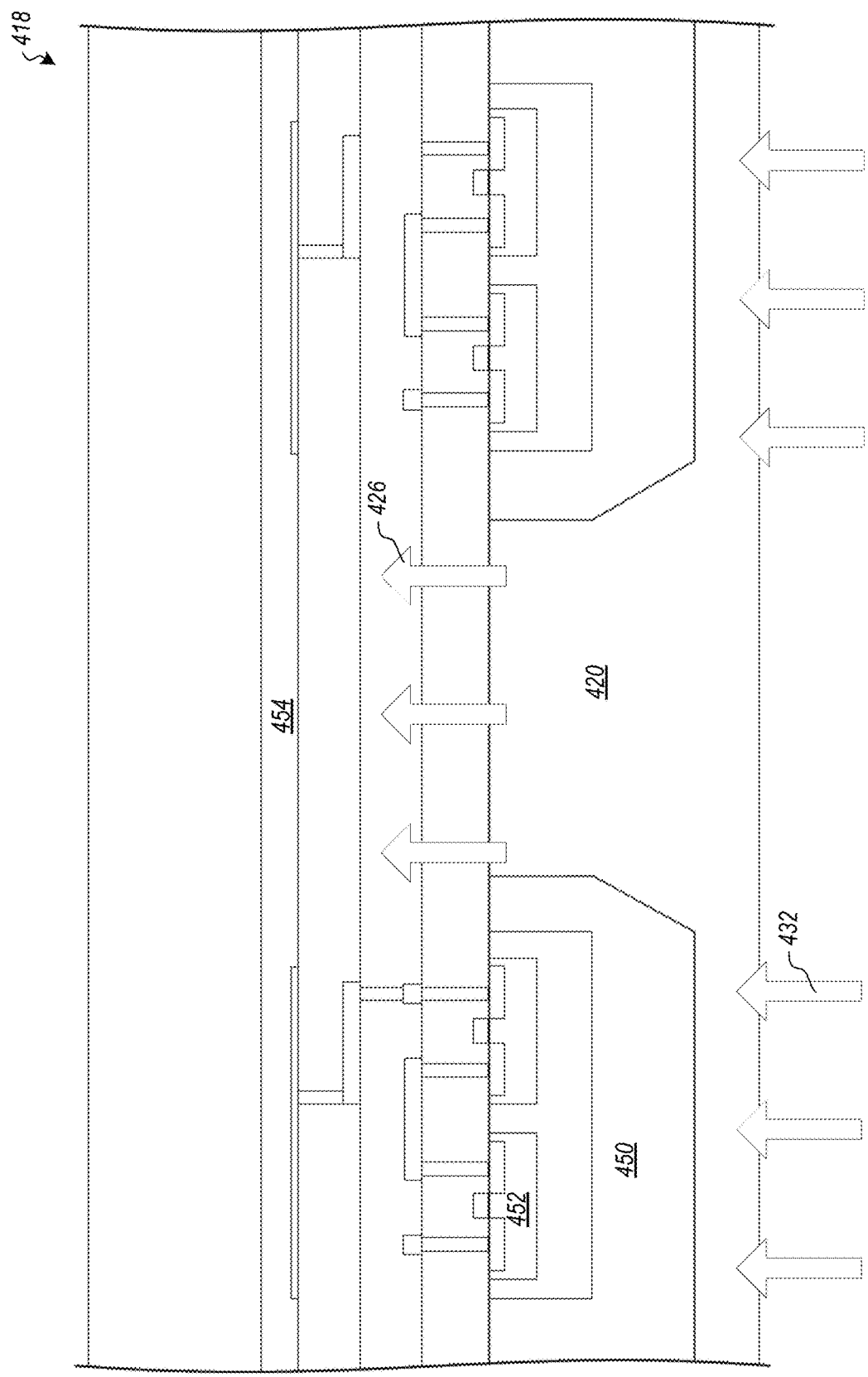
FIG. 4 illustrates a transparent display structure cross-section view, including transparent regions.

The transparent regions shown in the preceding figures can be created in a number of particular ways. In some embodiments, the transparent regions can be created by using the processes described in U.S. patent application Ser. No. 16/686,306 titled "Backside Etch Process For Transparent Silicon Oxide Technology", which is incorporated herein by reference in its entirety. Briefly, that application describes a process for creating transparent regions in otherwise opaque portions of semiconductor materials. For example, reference is now made to FIG. 4 which illustrates a transparent display 418 including active silicon islands (which may be native silicon islands) such as active silicon island 450. In particular, active silicon islands include transistors such as transistor 452 which control OLED emitters in an OLED stack 454. Note, that as alluded to above, transistors may control detectors, such as various photodiodes or other detectors, in addition or alternatively. In the example illustrated in FIG. 4, each of the active silicon islands represents a pixel or subpixel of the transparent display 418. Thus, by illuminating various LEDs in the OLED stack 454 using the transistors in the active silicon islands, an image can be created and output to a user, such as by outputting display light such as the display light 326 illustrated in FIG. 3.

As illustrated in FIG. 3, intensified light is transmitted through the transparent display 318 to the eyepiece of the nightvision system, and then to the user. Note, however, that the intensified light is transmitted to the user through the transparent display 318, meaning that the intensified light will be affected by characteristics of the transparent display 318.

Referring once again to FIG. 4, light 426 represents a portion of light that is transmitted through transparent regions, illustrated by transparent region 420, of the transparent display 418, while light 432 represents a portion of light that is blocked by active portions of the transparent display 418. Note that in some embodiments, the transparent region 420 is backfilled with a transparent back fill material.

However, transmission of light through the transparent display is nonetheless increased by removing portions of silicon that are not needed for implementing active electrical components or for supporting metal traces. For example, consider an example where dynamic pixel cells are used. In this particular example, assume that there are two subpixels per pixel. Anode size for the subpixels is 8 μm×5.1 μm. Pixel area is 10.1 μm×12.4 μm. Pixel pitch is 22.5 μm×22.5 μm. In one example, this provides a resolution of 800×800. In this particular transparent display, if non-active silicon islands (not shown) that are typically implemented are not removed, transparency of the transparent display is about 33%. In contrast, transparency is about 61% if the non-active silicon islands are removed such as in the structure illustrated in FIG. 4. Thus, in this example, transparency of a transparent display is increased by more than 80% by removing silicon and/or oxide trenches.

Note that various engineering trade-offs can be made to meet certain requirements. For example, increased transparency can be obtained by having a lower resolution and/or using fewer subpixels as there is more space between pixels and/or subpixels. If a higher resolution is needed, then that transparent display will have a lower transparency than an equivalently sized transparent display with a lower resolution. Thus, for example, a transparent display with a 36 μm pitch can obtain a transparency of 81%, while a transparent display of 22.5 μm pitch can obtain a transparency of 67%, while a transparent display having a 17.5 μm pitch will be about 55% transparency when non-active silicon islands are removed from the transparent display in each of the illustrated examples. Thus, some embodiments may be able to create a transparent display with at least a 36 μm pitch with at least a transparency of 75%, or a transparent display of at least a 22.5 μm pitch with at least a transparency of 60%, or a transparent display having at least a 17.5 μm pitch with at least a 50% transparency when silicon is removed between active silicon islands. The preceding illustrates one specific example related to a particular manufacturing process.

Pitch and transparency values may be specific to a given semiconductor manufacturing process—also known as the technology or process node—and will of course vary as the node changes. Typically designating the process's minimum feature size, the technology node will dictate the area of required active silicon for the display CMOS based on the transistor size. As the node minimum feature size decreases, whether it be through alternate foundries or improvements in technology, the same need for maximizing transparency applies. Indeed, the benefit to removing non-active silicon islands improves as the ratio of inactive- to active-silicon increases with smaller transistors.

The example numbers described herein are derived assuming a 180 nm technology/process node, although similar calculations can be performed for any specific technology size.

As noted above, transparency of the transparent display 318 can be affected by the number per area (corresponding to pitch) and lateral size of active components used to implement displaying portions (or detector portions) of the transparent display 318. Thus, higher functionality displays may have a natural tendency to be less transparent to intensified light than lower functionality displays.

Referring now to FIG. 5, additional details are illustrated. FIG. 5 illustrates a transparent display 518 where the transparent display includes detectors interdigitated with display subpixels in the transparent display 518. In the example illustrated in FIG. 5, two pixels 502 and 504 are compared and contrasted. In particular, pixel 502 includes a red subpixel, a green subpixel, a blue subpixel, and a white subpixel 506. FIG. 5 further illustrates another pixel 504. The pixel 504 includes a red subpixel, a green subpixel, a blue subpixel, and a detector 508. By controlling the various intensities of the various subpixels, various color hues and light intensities can be displayed to a user. Thus, in this example, various pixels are interdigitated together with some pixels including a white subpixel, such as the subpixel 506, while other subpixels include a detector, such as the detector 508 included as a subpixel element.

While the example illustrated in FIG. 5 shows one example of subpixel arrangements, it should be appreciated that in other embodiments other arrangements may be implemented. For example, in some embodiments, pixels can be implemented using only red and green subpixels. This can be accomplished inasmuch as red and green light emitters can be used to create a fairly accurate representation of an environment, particularly when image intensifiers use P45 phosphors that emit blue-white light, which can be used to reconstruct an environment scene when mixed appropriately with red and green lights of various intensities. In such embodiments, certain pixels may have a detector substituted for a red subpixel while other pixels have a detector substituted for a green subpixel. This can result in an average number of red subpixels and green subpixels being substantially similar over the entirety of the transparent display 518.

Alternatively, some embodiments may include pixels with red subpixels, green subpixels, and white subpixels or detectors. That is, embodiments may be implemented where a pixel either has a white subpixel or a detector, but not both.

Alternatively or additionally, some embodiments may be implemented where a relatively few number of pixels include subpixel scale detectors. In particular, in the example illustrated in FIG. 5, only 50% of the pixels include a detector meaning that a detector array will have a resolution that is about half of what the resolution of the display portions of the transparent display 518 exhibit. However, in alternative embodiments, 25% of the pixels may include a detector when lower detector resolutions are acceptable. Other percentages may be implemented depending on the particular purposes of the detector arrays in the transparent displays.

Some embodiments may be implemented where output pixels are formed in a number of subpixel patterns. For example, a first pattern is formed to accommodate a detector in the first pattern and a second pattern is formed without a detector in the second pattern. An example of this is illustrated in FIG. 5, where some patterns include detectors and others do not.

Figure 6:
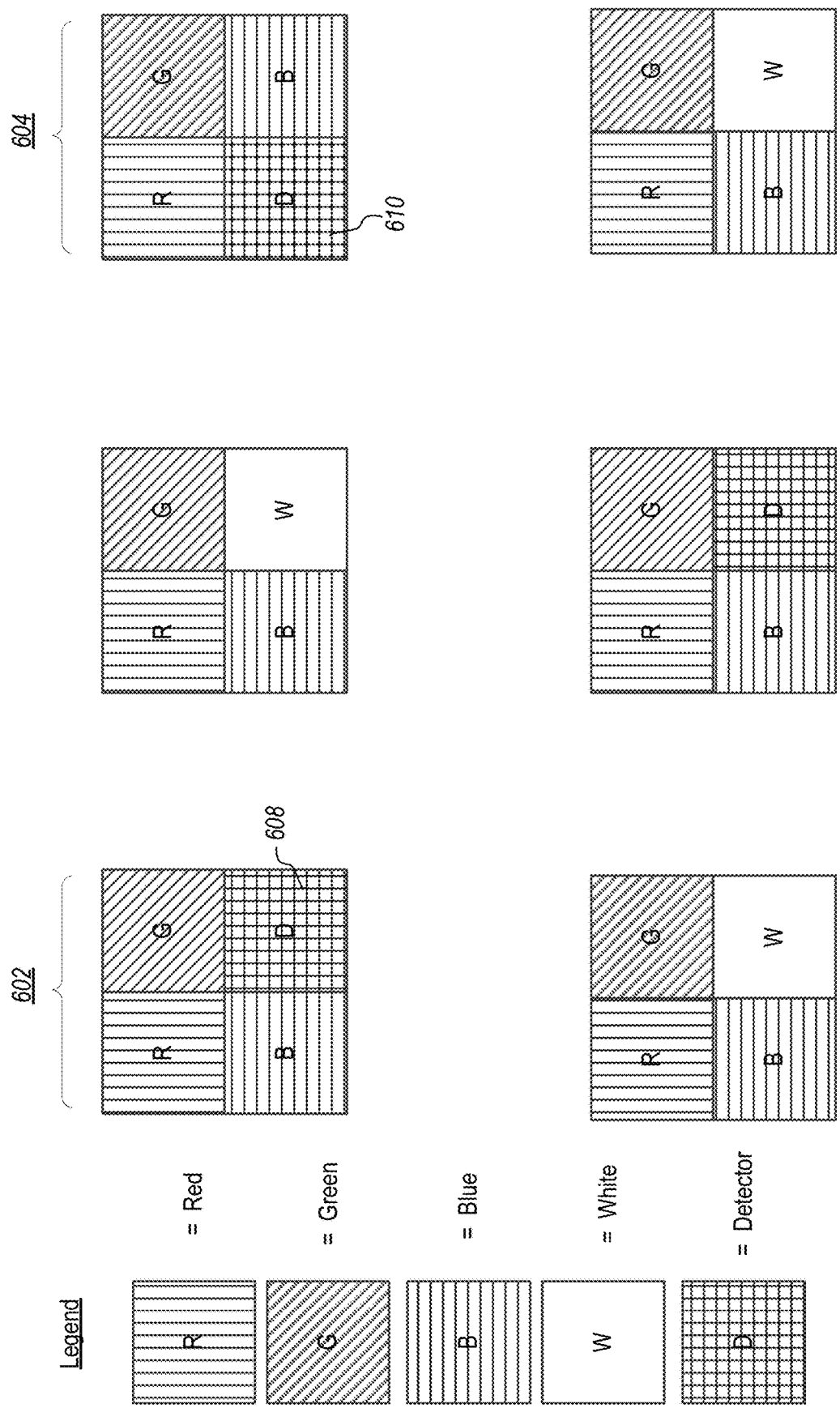
FIG. 6 illustrates a transparent display having display elements interdigitated among subpixel display elements where placement of detector elements differ.

In an alternative embodiment, output pixels are formed in a number of subpixel patterns where a first pattern is formed to accommodate a detector in a first location in the first pattern and a second pattern is formed to accommodate a detector in a different second location in the second pattern. An example of this is illustrated in FIG. 6, where detectors 608 and 610 are located in different locations of their respective patterns. This can be done to accomplish certain color effects, to prevent screen door effects, or for other reasons.

By implementing the detectors in a subpixel scale, embodiments can implement both higher resolution displays in combination with higher resolution detector arrays then would be ordinarily able to be implemented if the detectors were implemented as each their own pixel.

Some embodiments may be implemented where metallization and interconnect routing layouts are implemented in a similar fashion across pixels, whether the pixels include detectors or not. In particular, rather than design the pixel metallization or interconnect routing layouts unique to each zone within the display, embodiments apply the most complex metallization and/or interconnect routing layouts to all segments to ensure similar driving strength for devices and simpler masking during manufacturing.

Figure 7:
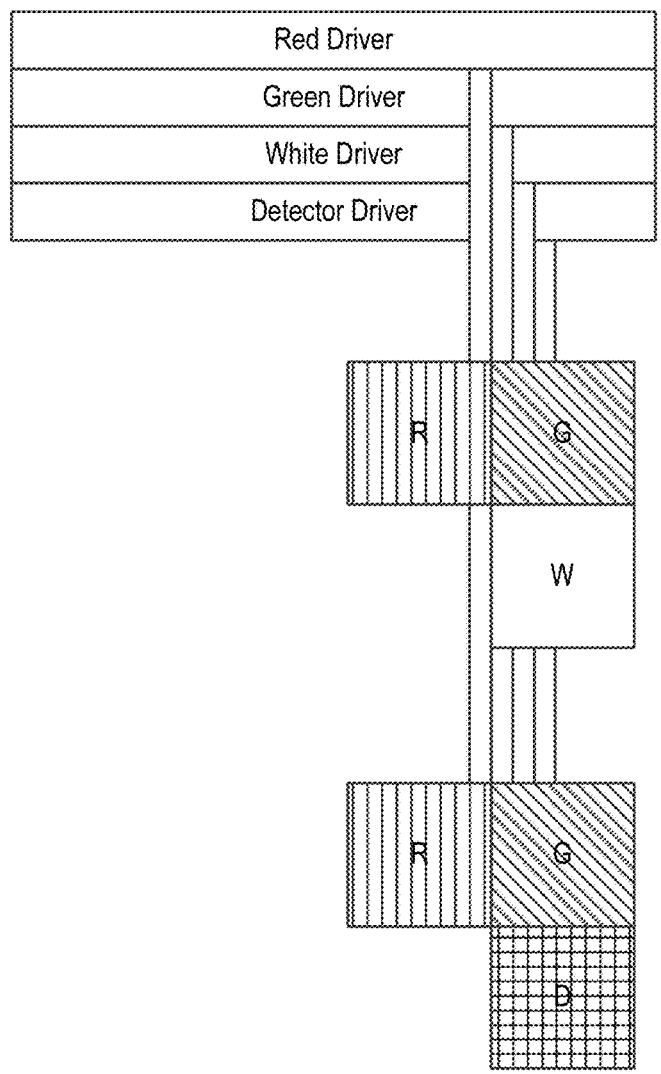
FIG. 7 illustrates an example trace layout.
Figure 8:
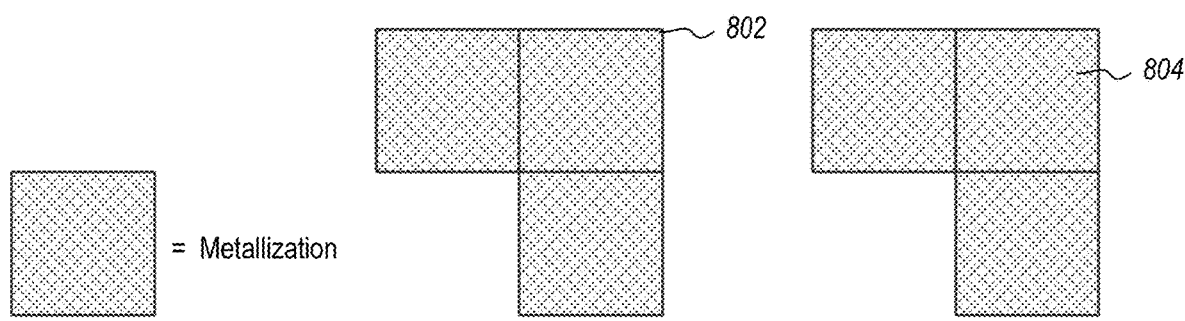
FIG. 8 illustrates an example metallization layout.

Examples are illustrated with respect to FIGS. 7 and 8. In particular, FIG. 7 illustrates an example where a first pixel includes three color subpixels, including a red, green and white subpixels. In contrast a second pixel includes two color subpixels including red and green subpixels, but excluding a which subpixel, and instead uses a detector subpixels. Nonetheless, both pixels include routing layouts from red, green, white, and detector drivers to the various subpixels. However, the traces from the detector driver to the subpixels in the first pixel will be unused, as will the traces from the white subpixel driver to the second pixel. Thus, some embodiments may include routing layouts to all pixels having traces for all subpixels and detectors in any pixel. Thus, the same routing layout can be used for any pixel in the optical device.

Similarly, attention is directed to FIG. 8, which shows similar pixel metallization in pixels with different subpixel configurations. In particular, the metallization for the different pixels is the same size. For example, a first pixel is shown with metallization 802 appropriate for pixels having red, and green subpixels and a detector. Identical metallization 804 is implemented in a second pixel which has red and green subpixels, but excludes detectors.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
    a stacked device, formed in a single semiconductor chip, configured to be coupled in an overlapping fashion to an underlying device, the stacked device comprising:
        a plurality of optical output pixels, each of the output pixels comprising a plurality of subpixels, wherein each subpixel is configured to output a color of light, and wherein each pixel is configured to output a plurality of colors of light;
        one or more detectors, configured to detect light, interleaved with the subpixels of the pixels; and
        wherein the stacked device comprises a plurality of transparent regions formed in the stacked device between the pixels, the plurality of transparent regions being transparent, according to a first transmission efficiency, to light in a first spectrum, wherein the underlying device emits light in the first spectrum.

2. The optical device of claim 1, wherein the plurality of output pixels are formed by a plurality of subpixel patterns, a first pattern being formed to accommodate a detector in the first pattern and a second pattern being formed without a detector in the second pattern.

3. The optical device of claim 1, wherein the plurality of output pixels are formed by a plurality of subpixel patterns, a first pattern being formed to accommodate a detector in a first location in the first pattern and a second pattern being formed to accommodate a detector in a different second location in the second pattern.

4. The optical device of claim 1, wherein the plurality of optical output pixels implement a display and wherein the detectors implement a photodetector with approximately 50% of the resolution of the display.

5. The optical device of claim 1, wherein metallization for different pixels configurations having different numbers of subpixel elements is the same size.

6. The optical device of claim 1, wherein interconnect routing is the same for different pixels having different elements.

7. The optical device of claim 1, wherein the plurality of output pixels are formed to have red and green subpixels in a fashion where some pixels have a detector substituted for a red subpixel while other pixels have a detector substituted for a green subpixel, resulting in an average number of red subpixels and green subpixels being substantially similar over the entirety of the optical device.

8. The optical device of claim 1, wherein the plurality of output pixels are formed to have red, green, and white subpixels in a fashion where some pixels have a white subpixel while other pixels have a detector substituted for a white subpixel.

9. A method of manufacturing an optical device, the method comprising:
    forming a stacked device in a single semiconductor chip, configured to be coupled in an overlapping fashion to an underlying device, wherein forming the stacked device comprising:
        forming a plurality of optical output pixels, each of the output pixels comprising a plurality of subpixels, wherein each subpixel is configured to output a color of light, and wherein each pixel is configured to output a plurality of colors of light;
        forming one or more detectors, configured to detect light, interleaved with the subpixels of the pixels; and
        forming a plurality of transparent regions in the stacked device between the pixels, the plurality of transparent regions being transparent, according to a first transmission efficiency, to light in a first spectrum, wherein the underlying device emits light in the first spectrum.

10. The method of claim 9, wherein the plurality of output pixels are formed by a plurality of subpixel patterns, a first pattern being formed to accommodate a detector in the first pattern and a second pattern being formed without a detector in the second pattern.

11. The method of claim 9, wherein the plurality of output pixels are formed by a plurality of subpixel patterns, a first pattern being formed to accommodate a detector in a first location in the first pattern and a second pattern being formed to accommodate a detector in a different second location in the second pattern.

12. The method of claim 9, wherein the plurality of optical output pixels are formed to implement a display and wherein the detectors are formed to implement a photodetector with approximately 50% of the resolution of the display.

13. The method of claim 9, further comprising forming metallization for different pixels configurations having different numbers of subpixel elements to be the same size.

14. The method of claim 9, further comprising forming interconnect routing to be the same for different pixels having different elements.

15. The method of claim 9, wherein the plurality of output pixels are formed to have red and green subpixels in a fashion where some pixels have a detector substituted for a red subpixel while other pixels have a detector substituted for a green subpixel, resulting in an average number of red subpixels and green subpixels being substantially similar over the entirety of the optical device.

16. The method of claim 9, wherein the plurality of output pixels are formed to have red, green, and white subpixels in a fashion where some pixels have a white subpixel while other pixels have a detector substituted for a white subpixel.

17. A method of emitting and detecting light, the method comprising:

at a stacked device, formed in a single semiconductor chip, coupled in an overlapping fashion to an underlying device, outputting light from a plurality of optical output pixels, each of the output pixels comprising a plurality of subpixels, wherein each subpixel outputs a color of light, and wherein each pixel outputs a plurality of colors of light;

at the stacked device, detecting light using one or more detectors interleaved with the subpixels of the pixels; and at the stacked device, transmitting light from the underlying device through the stacked device through a plurality of transparent regions formed in the stacked device between the pixels, the plurality of transparent regions being transparent, according to a first transmission efficiency, to light in a first spectrum, wherein the underlying device emits light in the first spectrum.

18. The method of claim 17, detecting light is performed with about 50% of the resolution of outputting light.

19. The method of claim 17, further comprising performing control of different pixels using metallization for different pixels configurations having different numbers of subpixel elements that is the same size.

20. The method of claim 17, further comprising performing control of different pixels using interconnect routing that is the same for different pixels having different elements.

* * * * *